(12) United States Patent
Alptekin et al.

(10) Patent No.: US 8,492,275 B2
(45) Date of Patent: Jul. 23, 2013

(54) METHOD TO FORM UNIFORM SILICIDE BY SELECTIVE IMPLANTATION

(75) Inventors: Emre Alptekin, Wappingers Falls, NY (US); Viraj Y. Sardesai, Poughkeepsie, NY (US); Cung D. Tran, Newburgh, NY (US); Bin Yang, Yorktown Heights, NY (US)

(73) Assignees: International Business Machines Corporation, Armonk, NY (US); GlobalFoundries, Inc., Grand Cayman (KY)

( * ) Notice: Subject to any disclaimer, the term of this patent is extended or adjusted under 35 U.S.C. 154(b) by 161 days.

(21) Appl. No.: 13/186,519

(22) Filed: Jul. 20, 2011

(65) Prior Publication Data

US 2013/0020705 A1 Jan. 24, 2013

(51) Int. Cl.
*H01L 21/44* (2006.01)

(52) U.S. Cl.
USPC ............. 438/682; 438/630; 257/E21.438; 257/E21.439

(58) Field of Classification Search
USPC .................................................. 438/630, 682
See application file for complete search history.

(56) References Cited

U.S. PATENT DOCUMENTS

| | | | |
|---|---|---|---|
| 5,444,024 A | 8/1995 | Anjum et al. | |
| 6,072,222 A | 6/2000 | Nistler | |
| 6,444,553 B1 | 9/2002 | Zagozdson-Wosik et al. | |
| 6,555,880 B2 | 4/2003 | Cabral, Jr. et al. | |
| 6,657,244 B1 | 12/2003 | Dokumaci et al. | |
| 6,716,708 B2 | 4/2004 | Cabral, Jr. et al. | |
| 6,734,099 B2 | 5/2004 | Zhao et al. | |
| 7,264,982 B2 | 9/2007 | Cheng et al. | |
| 7,482,276 B2 | 1/2009 | Lee et al. | |
| 7,867,854 B2 | 1/2011 | Lin et al. | |
| 2003/0057496 A1* | 3/2003 | Shiau et al. | 257/355 |
| 2010/0112791 A1 | 5/2010 | Suzuki et al. | |
| 2013/0032881 A1* | 2/2013 | Piao et al. | 257/343 |
| 2013/0049164 A1* | 2/2013 | Baars et al. | 257/509 |
| 2013/0069124 A1* | 3/2013 | Yang et al. | 257/288 |

* cited by examiner

*Primary Examiner* — Daniel Whalen
(74) *Attorney, Agent, or Firm* — Gibb & Riley, LLC; Yuanmin Cai, Esq.

(57) ABSTRACT

Methods form an integrated circuit structure by forming at least a portion of a plurality of devices within and/or on a substrate and patterning trenches in an inter-layer dielectric layer on the substrate adjacent the devices. The patterning forms relatively narrow trenches and relatively wide trenches. The methods then perform an angled implant of a compensating material into the trenches. The angle of the angled implant implants a greater concentration of the compensating material in the regions of the substrate at the bottom of the wider trenches relative to an amount of compensating material implanted in the regions of the substrate at the bottom of the narrower trenches. The methods then deposit a metallic material within the trenches and heat the metallic material to form silicide from the metallic material.

14 Claims, 3 Drawing Sheets

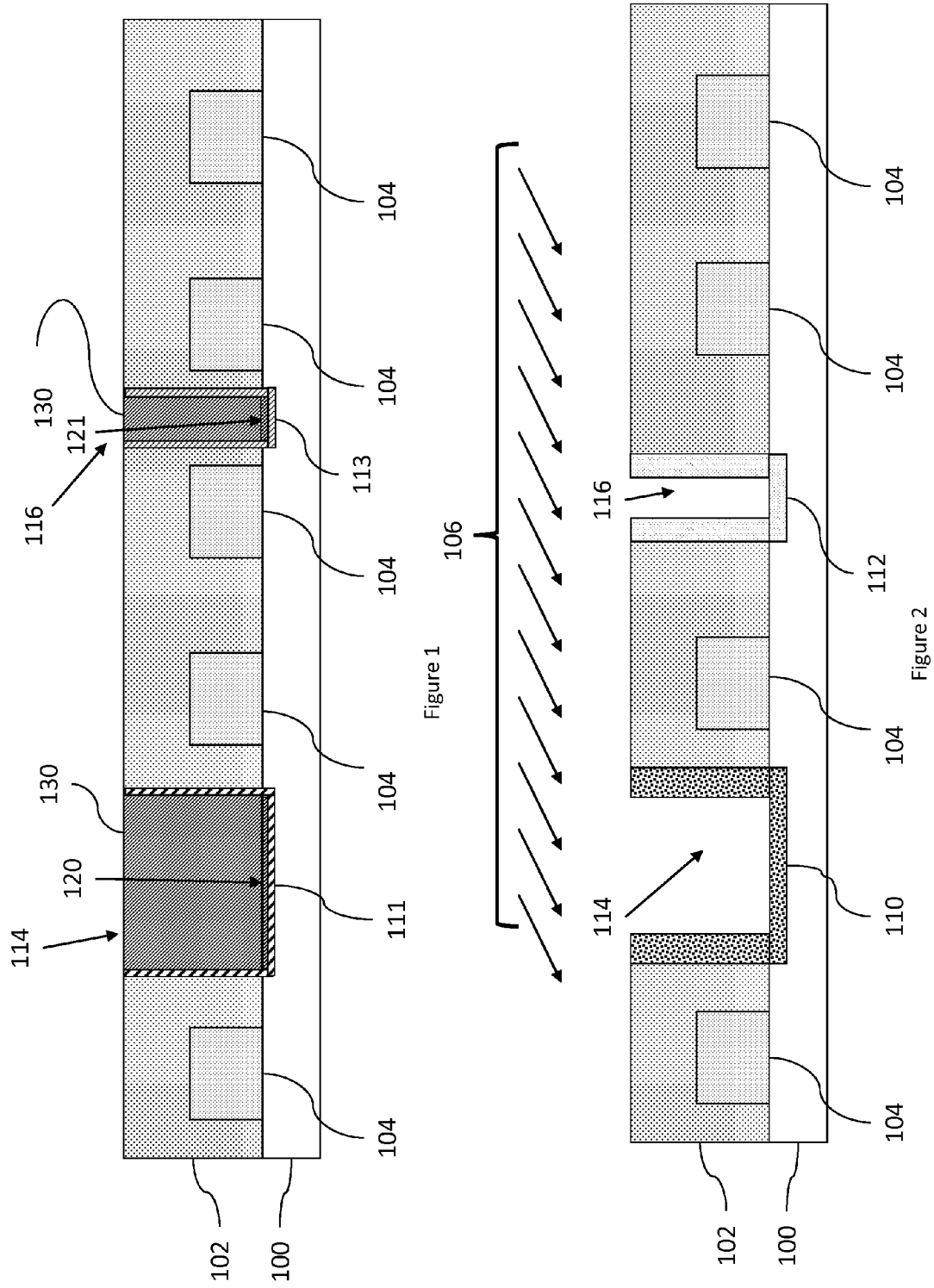

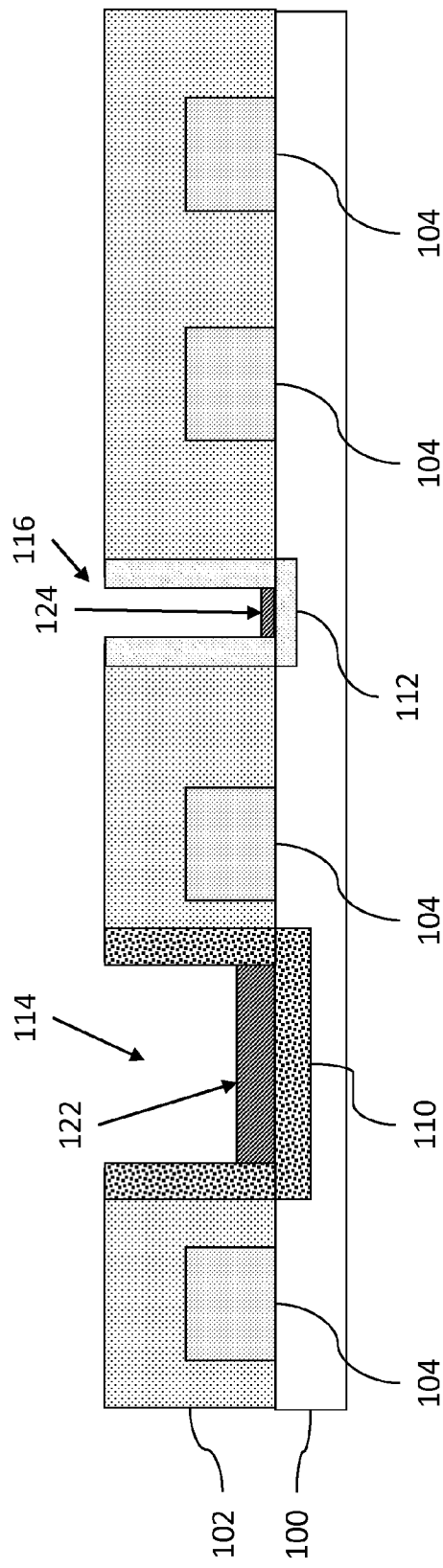
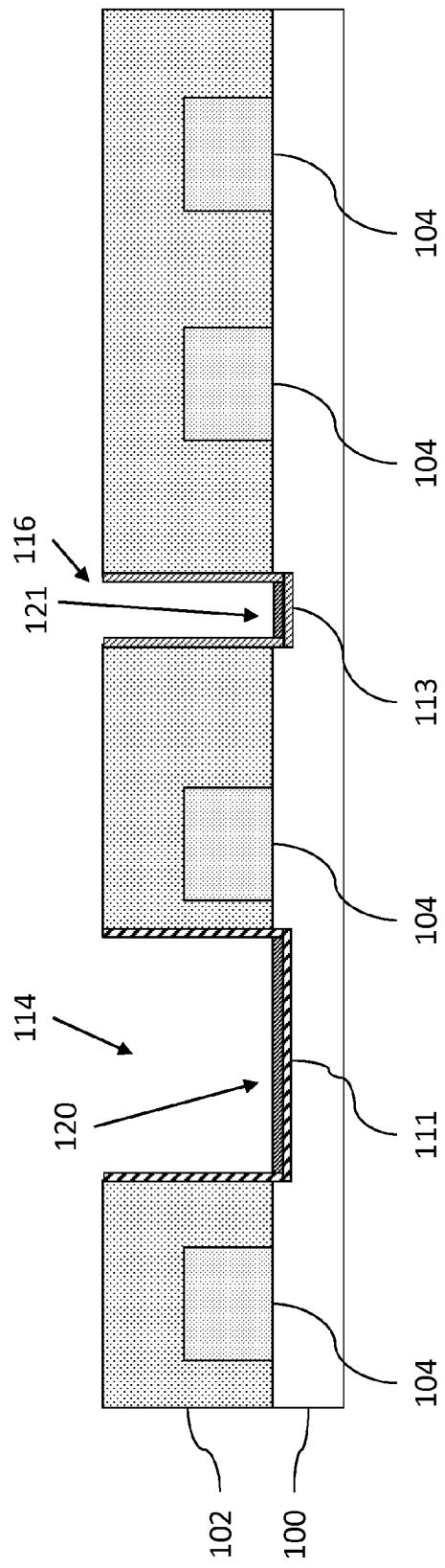

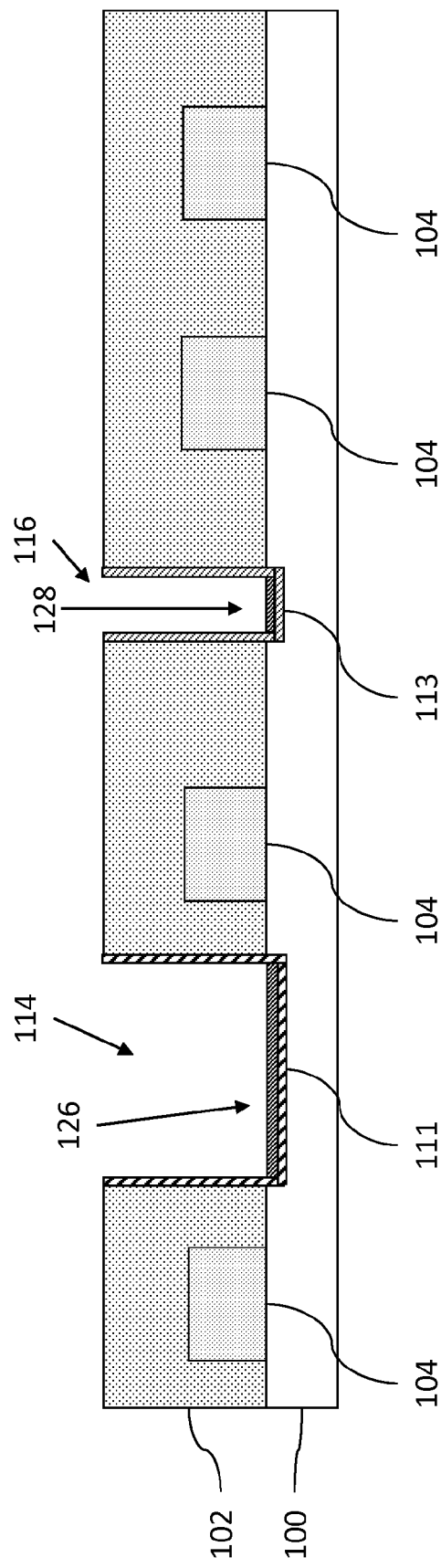

METHOD TO FORM UNIFORM SILICIDE BY SELECTIVE IMPLANTATION

BACKGROUND

The present embodiments relate to the formation of integrated circuit structures, and more specifically to forming uniform (one example of uniformity is the same thickness) silicides in both narrow and wide trenches.

Many elegant and sophisticated processes are utilized during the formation of modern integrated circuit devices. One advance that has reduced electrical resistance is the silicidation process, which deposits a metallic layer on silicon and then performs a thermal (heating) cycle to allow the silicon to consume the metal and form a very low resistance material known as silicide. However, various issues arise when attempting to provide uniformity to the various silicides within an integrated circuit device, and the embodiments described below address such issues.

SUMMARY

One exemplary method herein patterns trenches in an insulating layer, such as an inter-layer dielectric layer. The patterning forms relatively narrow trenches and relatively wide trenches. The method then performs an angled implant of a compensating material (that retards silicidation) into the trenches. The angle of the angled implant implants a greater concentration of the compensating material in the material at the bottom of the wider trenches relative to an amount of compensating material implanted in the material at the bottom of the narrower trenches. This method then deposits a metallic material within the trenches and heats the metallic material to form silicide from the metallic material.

Another exemplary method herein forms an integrated circuit structure by patterning trenches in an inter-layer dielectric layer. The patterning forms relatively narrow trenches and relatively wide trenches. The method then performs an angled implant of a compensating material (that can, for example, retard silicidation) into the trenches. The angle of the angled implant implants a greater concentration of the compensating material in the material at the bottom of the wider trenches relative to the amount of compensating material implanted in the material at the bottom of the narrower trenches. This method deposits a metallic material within the trenches, which forms a relatively thin layer of the metallic material in the regions of the substrate 100 at the bottom of the narrower trenches and a relatively thick layer of the metallic material in the regions of the substrate 100 at the bottom of the wider trenches. The process then heats the metallic material to form silicide from the metallic material. The greater concentration of compensating material compensates for the relatively thick layer of the metallic material to cause the same thickness of the silicide to be formed in the regions of the substrate 100 at the bottom of the narrower trenches and the wider trenches.

An integrated circuit structure embodiment herein includes a plurality of devices within and/or on a substrate and trenches in an inter-layer dielectric layer on the substrate. The trenches comprise relatively narrow trenches and relatively wide trenches. Further, silicide is in the trenches, and the silicide is formed from a relatively thin layer of a metallic material in the regions of the substrate 100 at the bottom of the narrower trenches and a relatively thick layer of the metallic material in the regions of the substrate 100 at the bottom of the wider trenches. However, the same amount of the silicide is in the regions of the substrate 100 at the bottom of the narrower trenches and the wider trenches because a compensating material (that retards silicidation) is in the material at the bottom of the trenches. Further, with embodiments herein, a greater concentration of the compensating material is in the material at the bottom of the wider trenches relative to the amount of compensating material in the regions of the substrate 100 at the bottom of the narrower trenches, and the greater concentration of compensating material compensates for the relatively thick layer of the metallic material used to form the silicide.

BRIEF DESCRIPTION OF THE SEVERAL VIEWS OF THE DRAWINGS

The embodiments will be better understood from the following detailed description with reference to the drawings, which are not necessarily drawing to scale and in which:

FIG. 1 is a schematic diagram of a completed integrated circuit structure according to embodiments herein;

FIG. 2 is a schematic diagram of a partially completed integrated circuit structure according to embodiments herein;

FIG. 3 is a schematic diagram of a partially completed integrated circuit structure according to embodiments herein;

FIG. 4 is a schematic diagram of a partially completed integrated circuit structure according to embodiments herein; and FIG. 5 is a schematic diagram of a partially completed integrated circuit structure according to embodiments herein.

DETAILED DESCRIPTION

As mentioned above, various issues arise when attempting to provide uniformity to the various silicides within an integrated circuit device. Therefore, this disclosure provides a method to form the same thickness silicide in different areas, such as narrow and wide trench openings. For example, source/drain contacts may require a silicide formation in a trench structure (such as via opening). The silicide thickness in all source/drain regions should be similar, and this silicide thickness can be controlled by the deposited metal layer thickness. However, as the silicided region length is scaled down, forming the same thickness silicide in areas such as narrow and wide trench openings becomes more difficult due to non-uniform metal thickness that can occur over different size trench openings, having different aspect ratios.

Thicker silicide is normally formed in wide trenches (due to more silicide-forming metal being received by the wide trenches than narrow trenches). To counteract the above effect, the embodiments herein perform an angled implantation to implant more silicide retarding species in wide trenches (compared with narrow trenches). The retarding species counteracts the thicker metal layer in the wide trenches, thereby causing relatively the same thickness silicide to be formed in both the narrow trenches and the wide trenches.

More specifically, the embodiments herein perform, in one embodiment, an angled implant of a silicide retarding species after trench formation. Certain elements (including C, S, Se, Al, etc.) retard metal-silicon reaction and reduce metal consumption during silicidation. An angled retarding species implant allows the retarding species to reach the wide trenches, but substantially prevents the retarding species from reaching the more narrow trenches, due to shadowing that occurs in the narrow trenches. The upper portion of the sidewalls of both trenches may actually receive the same amount of implantation because the shadowing effect is much less in such portions. Following the implantation, metal is deposited and silicide is formed. The implant dose/energy/angle and silicide formation temperature can be altered to ultimately result in the same silicide amount (thickness) in both the narrow and wide openings.

Further, this disclosure provides ways to modify large contact areas to produce the same amount of silicide as is produced in narrow areas, to produce different silicide phases, to change source/drain characteristics of larger areas vs. small areas, to provide amorphization of large areas, etc.

FIG. 1 illustrates an exemplary integrated circuit structure that includes a plurality of devices 104 within and/or on a substrate 100 (such as a silicon-based substrate) and trenches 114, 116 in an insulating layer 102, such as an inter-layer dielectric layer that is on the substrate 100 and is adjacent the devices 104. Such "devices" 104 can comprise any form of integrated circuit device including, but not limited to, transistors, capacitors, contacts, etc. The substrate 100 and inter-layer dielectric layer 102 can comprise any form of layers within a multi-layer integrated circuit device. Therefore, the substrate 100 can comprise an insulator layer, a semiconductor layer, and/or a layer that contains many devices. Similarly, inter-layer dielectric layer 102 can comprise an electrical insulator layer that contains devices, wiring, insulation etc. Those ordinarily skilled in the art would understand that layers 100, 102 are arbitrarily shown to include generic devices 104 in order to maintain focus on the salient features surrounding the trenches 114, 116 that are discussed below.

The trenches 114, 116 shown in FIG. 1 comprise relatively narrow trenches 116 and relatively wide trenches 114 that are filled with a conductor 130. These trenches 114, 116 may comprise any form of structure, including conductive vias, wires, or contacts, and/or may be formed on top of source and drain regions of a transistor. In FIG. 1, trenches 114 and 116 are shown in relatively simple shapes in order to simplify the illustrations. The conductor 130 can comprise any common conductor including metal such as copper, aluminum, tungsten, etc. or alloys thereof, etc.

Further, silicide 120, 121 is shown as being in the regions at the bottom of the trenches 114, 116. As described below, the silicide 120, 121 is formed from a relatively thin layer of a metallic material 124 in the regions of the substrate 100 at the bottom of the narrower trenches 116 and a relatively thick layer of the metallic material 122 in the regions of the substrate 100 at the bottom of the wider trenches 114. However, the same amount (same thickness) of silicide 120, 121 is in both the narrower trenches 116 and the wider trenches 114 because at least trace amounts of a compensating material 111, 113 (that can retard silicidation or make the silicide different in the narrow and wide trenches) is in the regions of the substrate 100 at the bottom of the trenches 114, 116.

More specifically, with embodiments herein, a greater concentration of the trace amounts of compensating material 111 is in the regions of the substrate 100 at the bottom of the wider trenches 114 relative to the amount of trace amounts of compensating material 113 in the regions of the substrate 100 at the bottom of the narrower trenches 116. A greater concentration of compensating material 110, discussed below (from which the trace amounts of compensating material 111 originate) compensates for the relatively thick layer of the metallic material 122 used to form the silicide 120, 121. More specifically, the compensating material 110, 112 (discussed below) can either retard silicide formation or can alter a characteristic of the silicide, such as resistivity, crystalline structure and orientation, amorphous nature of the silicide, etc. In doing so, the compensating material 110, 112 (from which the trace amounts of compensating material 111, 113 originate) compensates for and counteracts the difference that would otherwise occur because of the different weaknesses of the metallic material 122 from which the silicide is formed.

The structure shown in FIG. 1 is formed by the processing shown in FIGS. 2-4. Therefore, as shown in FIG. 2, one exemplary method herein forms at least a portion of a plurality of devices 104 within and/or on a substrate 100. Therefore, the devices 104 shown in the drawings can be completed devices or devices that are partially complete and are in the process of being manufactured.

In FIG. 2, the method patterns trenches 114, 116 in the inter-layer dielectric layer 102 adjacent the devices 104. The patterning forms relatively narrow trenches 116 and relatively wide trenches 114. When patterning any material herein, the material to be patterned can be grown or deposited in any known manner on any planar surface to be patterned, and a patterning layer (such as an organic photoresist) can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

As shown by the arrows 106, the method then performs an angled implant of a compensating material (that can retard silicidation) into the trenches. The material 110, 112 is referred to as a "compensating" or "retarding" material herein because, in some embodiments it retards the formation of silicide to compensate for the larger amount of metal that will form in the bottom of the larger trenches relative to the smaller trenches. Alternatively, the compensating material can alter a characteristic of the silicide, such as resistivity, crystalline structure and orientation, amorphous nature of the silicide, etc. Therefore, the compensating material 110, 112 can compensate for differences in thickness, resistivity, crystalline structure and orientation, amorphous nature, etc.

More specifically, because of the differences in aspect ratio between the wider trenches and the narrower trenches, the angled implant directs more of the compensating material 106 into the bottom of the wider trenches 114 and less compensating material 106 into the bottom of the narrower trenches 116. By using an angled ion implant of the compensating material 106, no additional masking, deposition, removal, etc., processes are required to form more of the compensating material 110 in the bottom of the wider trenches 114, relative to the lesser amount of compensating material 112 implanted in the bottom of the narrower trenches 116. As described below, the different aspect ratios also cause more metal to form in the bottom of the wider trenches 114 (relative to the narrower trenches 116) and the greater concentration of compensating material 110 provides a greater retarding effect on silicide formation in the regions of the substrate 100 at the bottom of the wider trenches 114 (relative to the narrower trenches 116) thereby compensating for the additional amount of metal that is formed in the bottom of the wider trenches 114.

In this way, the additional retarding (compensating) material 110 compensates for the additional metal within the regions of the substrate 100 at the bottom of the wider trenches 114 during the silicide formation process to counteract the effect of the additional metal and equalize the amount of silicide that is formed in the regions of the substrate 100 at the bottom of the wider trenches 114 and the narrower trenches 116. In other words, if the same amount of compensating material 106 were implanted in both the wider trenches 114 and narrower trenches 116, the additional amount of metal in the regions of the substrate 100 at the bottom of the wider trenches 114 would result in a greater mount of silicide being formed within the regions of the substrate 100 at the bottom of the wider trenches 114. However, because the angled implant of the compensating material 106 implants more of the compensating material 110 in the regions of the substrate 100 at the bottom of the bottom of the wider trenches 114, relative to the lesser amount of compensating material 112 implanted in the regions of the substrate 100 at the bottom of the bottom of the narrower trenches 116, this compensates by providing a larger retarding silicide formation effect in the regions of the substrate 100 at the bottom of the wider trenches 114 to essentially equalize the amount of silicide formed in the regions of the substrate 100 at the bottom of the wider trenches 114 and the narrower trenches 112.

As shown in the drawings, the angle of the angled implant is off to the side somewhat (is non-perpendicular to the top surface of the inter-layer dielectric layer 102). The angle of the angled implant implants a greater concentration of the compensating material 110 in the regions of the substrate 100 at the bottom of the wider trenches 114 relative to an amount of compensating material 112 implanted in the regions of the substrate 100 at the bottom of the narrower trenches 116. Therefore, the drawings illustrate compensating material 110 as being darker and having more particles than the compensating material 112, however both are formed from the same implant 106.

A phenomenon known as shadowing during an angled implant causes the greater concentration of the compensating material 110 to be implanted into the wider trenches 114. Shadowing occurs because the higher aspect ratio of the narrower trench 116 prevents the angled implant 106 from reaching very deep into the narrower trench 116. To the contrary, the lower aspect ratio of the larger trench 114 allows more of the angled ion implant 106 to reach into the larger trench 114.

Therefore, shadowing results from the difference in the size of the openings of the narrower trenches 116 and the wider trenches 114 (where this difference in size between the narrower trenches 116 and the wider trenches 114 can be measured along the top surface of the substrate 102). In extreme cases, with very sharply angled implantation processes, none of the compensating material may reach any part of the bottom of the narrower trenches 116, while in other cases, there will be substantially less of the compensating material 112 that reaches the narrower trenches 116. Because of the differences in aspect ratio between the wider trenches 114 and the narrower trenches 116, the angled implant directs more of the compensating material 106 into the bottom of the wider trenches 114 and less compensating material 106 into the bottom of the narrower trenches 116. The different aspect ratios of the different width trenches cause more metal to form in the bottom of the wider trenches 114 (relative to the narrower trenches 116) and the greater concentration of compensating material 110 provides a greater retarding effect on silicide formation in the regions of the substrate 100 at the bottom of the wider trenches 114 (relative to the narrower trenches 116) thereby compensating for the additional amount of metal that is formed in the bottom of the wider trenches 114. Because the compensating material 106 is applied at an angle, a larger amount is implanted within the bottom of the wider trenches 114 and this compensates for the larger amounts of metal that will form within the bottom of the wider trenches 114, thereby providing (in one example) more retardation of the silicide formation in the regions of the substrate 100 at the bottom of the wider trenches 114 (relative to the narrower trenches 116).

The methods herein can adjust the angle, dosage, energy level, etc. (depending upon the difference in size (width) between the narrower trenches 116 and the wider trenches 114) to control the amount of compensating material that is implanted into each of the different trenches. By controlling the amount of compensating material that each of the different trenches receives, the methods herein can balance the amounts of silicide that is formed within each of the trenches.

More specifically, the dosage, energy, and angle of the retarding material implant 106 can be adjusted to change the amount of compensating material 106 that implants in the bottoms of the trenches 114, 116. For example, as the angle of the implants 106 moves closer to perpendicular (becomes closer to 90°) to the upper surface of the inter-layer dielectric layer 102, the difference between the amount of retarding material that reaches the bottom of the wider trench 114 becomes more similar to the amount of retarding material that reaches the bottom of the narrower trench 116. To the contrary, as the angle of the implants 106 moves further away from perpendicular (moves further away from 90°) to the upper surface of the inter-layer dielectric layer 102, the difference between the amount of retarding material that reaches the bottom of the wider trench 114 becomes less similar to the amount of retarding material that reaches the bottom of the narrower trench 116. Therefore, by adjusting the angle of the retarding material implant 106, the relative amounts of retarding material that reaches the bottoms of the trenches 114, 116 can be changed and adjusted as necessary for each given situation.

Thus, because it is applied at an angle, the larger amount of compensating material 106 implanted within the bottom of the wider trenches 114 compensates for the larger amounts of metal that will form within the bottom of the wider trenches 114 by providing (in one example) more retardation of the silicide formation in the regions of the substrate 100 at the bottom of the wider trenches 114 (relative to the narrower trenches 116). The compensating material can be carbon (C), sulphur (S), selenium (Se), aluminium (Al), fluorine (Fl), or any other element, molecule, cluster, or any combination of these. As used herein, "implantation processes" can take any appropriate form (whether now known or developed in the future) and can comprise, for example, ion implantation, etc.

As shown in FIG. 3, the exemplary methods herein deposit a metallic material 122, 124 within the trenches. As currently practiced, the metallic material 122, 124 can comprise a metal layer including, but not limited to, tungsten (W), titanium (Ti), molybdenum (Mo), tantalum (Ta), nickel (Ni), platinum (Pt), cobalt (Co), erbium (Er), ytterbium (Yb), or any compound or combination of these.

This process forms a relatively thin layer of the metallic material 124 in the regions of the substrate 100 at the bottom of the narrower trenches 116 and a relatively thick layer of the metallic material 122 in the regions of the substrate 100 at the bottom of the wider trenches 114. The metallic material is the same in both trenches; however, it is given different numbers in the drawings because of its different thicknesses. Once again, the difference in width of the different trenches 114, 116 causes the different amounts of the metallic material 122, 124 to reach the bottoms of the different trenches. More specifically, the smaller opening of the narrower trench 116 limits the amount of metallic material that can enter the narrower trench 116, while the wider trench 114 can receive more metallic material.

Without the compensating material species 110, 112, the thicker layer of metallic material 122 would create more silicide than the thinner layer of metallic material 124. However, with the different amounts of compensating material species 110, 112, after at least one annealing (thermal heating) process (shown in FIG. 4) the same amount (thickness) of silicide 120, 121 is formed in the regions of the substrate 100 at the bottom of both the narrower trench 116 and the wider trench 114. Thus, the additional amount of metal 122 in the regions of the substrate 100 at the bottom of the wider trenches 114 would result in a greater mount of silicide being formed within the regions of the substrate 100 at the bottom of the wider trenches 114. However, because the angled implant of the compensating material 106 implants more of the compensating material 110 in the bottom of the wider trenches 114, relative to the lesser amount of compensating material 112 implanted in the bottom of the narrower trenches 116, this compensates for the excessive metal 122 by providing a larger retarding silicide formation effect in the regions of the substrate 100 at the bottom of the wider trenches 114 to essentially equalize the amount of silicide formed in the regions of the substrate 100 at the bottom of the wider trenches 114 and the narrower trenches 112. The amount of silicide formed is normally different for different width trenches; however, by adjusting the amount of compensating material that reaches the bottom of the trenches (by using the angled ion implant), the resulting silicide may be tuned to be the same, even though different amounts of metal are present in the different trenches during the silicide processing. Thus, the greater concentration of compensating material compensates for the relatively thick layer of the metallic material 122 to cause the same thickness of the silicide 120, 121 to be formed in the regions of the substrate 100 at the bottom of the narrower trenches 116 and the wider trenches 114.

Note that during the thermal annealing process shown in FIG. 4, most or all of the compensating material 110, 112 can be consumed; however, trace amounts 111, 113 of the compensating material 110, 112 sometimes remain in the final structure (although these trace amounts of compensating material 111, 113 can sometimes be transformed into somewhat different substances). A greater concentration of the trace amounts of compensating material 111 may remain in the regions of the substrate 100 at the bottom of the wider trenches 114 relative to the amount of trace amounts of compensating material 113 in the regions of the substrate 100 at the bottom of the narrower trenches 116. This greater concentration of compensating material 110, from which the trace amounts of compensating material 111 originate, compensates for the relatively thick layer of the metallic material 122 used to form the silicide 120, 121. Again, the compensating material 110, 112 can either retard silicide formation or can alter a characteristic of the silicide, such as resistivity, crystalline structure and orientation, amorphous nature of the silicide, etc. In doing so, the compensating material 110, 112 (from which the trace amounts of compensating material 111, 113 originate) compensates for and counteracts the difference that would otherwise occur because of the different weaknesses of the metallic material 122 from which the silicide is formed. Therefore, the trace amounts of compensating material 111, 113 are illustrated using different shading and numbers in FIGS. 1 and 4 to distinguish them from the unheated forms of compensating material 110, 112 illustrated in FIGS. 2 and 3.

In alternative embodiments, rather than forming a silicide 120, 121, the compensating material 110, 112 can alter a characteristic of the silicide, such as resistivity, crystalline structure and orientation, amorphous nature of the silicide, etc. Therefore, FIG. 5 illustrates different silicides 126, 128. These different silicides 126, 128 are formed to be different because of the different amounts of compensating material 110, 112 that reaches the trenches 114, 116 through the angled implant 106. In other words, a large amount of compensating material 110 may reach the wider trenches 114, while little or no compensating material reaches the narrower trenches 116. Therefore, during the silicide formation process, the silicide 126 will be formed differently from the silicide 128. FIG. 5 illustrates the post-anneal structure and, therefore, shows the traces of the compensating material 111 and 113, that are discussed above. Similarly, items 126, 128 can represent different silicide phases that are controlled by the amount of compensating material species. This can also be used to, for example, change the source/drain characteristics of larger areas vs. small areas, etc.

Referring again to FIG. 1, the conductor 130 is then formed over the silicide 120, 121 within the different trenches 114, 116. This completes the structure, or at least completes a layer of the overall integrated circuit structure, which can comprise, for example an integrated circuit chip.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of trenches are illustrated in the drawings, those ordinarily skilled in the art would understand that many different trenches could be simultaneously formed with the embodiment herein and the drawings are intended to show simultaneous formation of multiple different types of trenches; however, the drawings have been simplified to only show a limited number of transistors for clarity and to allow the reader to more easily recognize the different features illustrated. This is not intended to limit the embodiments because, as would be understood by those ordinarily skilled in the art, the embodiments is applicable to structures that include many of each type of trench shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiment was chosen and described in order to best explain the principles of the embodiments and the practical application, and to enable others of ordinary skill in the art to understand the embodiments for various embodiments with various modifications as are suited to the particular use contemplated.

What is claimed is:

1. A method of forming silicide comprising:
   forming a dielectric layer on a substrate;
   patterning trenches in said dielectric layer, said patterning forming relatively narrow trenches and relatively wide trenches;
   performing an angled implant of a compensating material that retards silicidation into said substrate at a bottom of said relatively narrow trenches and said substrate at a bottom of said relatively wide trenches in a process that implants a greater concentration of said compensating material in said substrate at said bottom of said wider trenches relative to an amount of compensating material implanted in said substrate at said bottom of said narrower trenches;
   depositing a metallic material within said relatively narrow trenches and said relatively wide trenches; and
   heating said metallic material to form silicide from said metallic material and said substrate.

2. The method according to claim 1, further comprising adjusting an angle of said angled implant depending upon a difference in size of a width between said narrower trenches and said wider trenches.

3. The method according to claim 1, wherein an angle at which said angled implant being performed is non-perpendicular to a top surface of said dielectric layer.

4. The method according to claim 1, said compensating material comprising at least one of carbon, sulfur, selenium, aluminum, and fluorine.

5. The method according to claim 1, said performing of said angled implant forming said greater amount of said compensating material in said wider trenches relative to said amount of compensating material formed in said narrower trenches because of different amounts of shadowing caused by different width sizes of said narrower trenches and said wider trenches.

6. The method according to claim 1, a difference in size between said narrower trenches and said wider trenches being measured along a top surface of said dielectric layer.

7. The method according to claim 1, said dielectric layer comprising an electrical insulator.

8. A method of forming an integrated circuit structure comprising:
   forming an inter-layer dielectric layer on a substrate comprising silicon;
   patterning trenches in said inter-layer dielectric layer, said patterning forming relatively narrow trenches and relatively wide trenches;
   performing an angled implant of a compensating material that retards silicidation into said relatively narrow trenches and said relatively wide trenches, an angle of said angled implant implanting a greater concentration of said compensating material in said substrate at a bottom of said wider trenches relative to an amount of compensating material implanted in said substrate at a bottom of said narrower trenches;
   depositing a metallic material within said relatively narrow trenches and said relatively wide trenches, said depositing forming a relatively thin layer of said metallic material in said narrower trenches and a relatively thick layer of said metallic material in said wider trenches; and
   heating said metallic material to form silicide from said metallic material and said substrate, said greater concentration of compensating material compensating for said relatively thick layer of said metallic material to cause a same thickness of said silicide to be formed in said substrate at said bottom of said narrower trenches and said substrate at said bottom of said wider trenches.

9. The method according to claim 8, further comprising adjusting said angle depending upon a difference in size of a width between said narrower trenches and said wider trenches.

10. The method according to claim 8, wherein an angle at which said angled implant being performed is non-perpendicular to a top surface of said dielectric layer.

11. The method according to claim 8, said compensating material comprising at least one of carbon, sulfur, selenium, aluminum, and fluorine.

12. The method according to claim 8, wherein said performing of said angled implant comprises applying different amounts of shadowing caused by different width sizes of said narrower trenches and said wider trenches in implanting said greater concentration of said compensating material in said substrate at said bottom of said wider trenches relative to said amount of compensating material implanted in said narrower trenches.

13. The method according to claim 8, a difference in size between said narrower trenches and said wider trenches being measured along a top surface of said inter-layer dielectric layer.

14. The method according to claim 8, said inter-layer dielectric layer comprising an electrical insulator.

* * * * *